(12) United States Patent
Lin

(10) Patent No.: US 6,740,557 B1
(45) Date of Patent: May 25, 2004

(54) SPACER LIKE FLOATING GATE FORMATION

(75) Inventor: Boson Lin, Hsin Chu (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/895,340

(22) Filed: Jul. 2, 2001

(51) Int. Cl.$^7$ .............................................. H01L 21/336
(52) U.S. Cl. ....................................................... 438/267
(58) Field of Search ................................. 438/267, 596, 438/201, 211, 257

(56) References Cited

U.S. PATENT DOCUMENTS

| | | | |
|---|---|---|---|
| 5,143,860 A | * 9/1992 | Mitchell et al. ............... 437/43 |
| 5,612,237 A | * 3/1997 | Ahn ............................ 437/43 |
| 5,989,960 A | 11/1999 | Fukase ........................ 438/267 |
| 6,027,972 A | 2/2000 | Kerber ........................ 438/257 |
| 6,051,470 A | 4/2000 | An et al. .................... 438/283 |
| 6,054,345 A | 4/2000 | Alsmeier et al. ............ 438/238 |
| 6,093,945 A | 7/2000 | Yang .......................... 257/317 |
| 6,103,575 A | 8/2000 | Chang ......................... 438/257 |
| 6,228,695 B1 | * 5/2001 | Hsieh et al. ................ 438/201 |
| 6,248,633 B1 | * 6/2001 | Ogura et al. ................ 438/267 |
| 6,326,662 B1 | * 12/2001 | Hsieh et al. ................ 438/316 |
| 6,465,833 B1 | * 10/2002 | Jung et al. .................. 257/314 |

* cited by examiner

Primary Examiner—David Nelms
Assistant Examiner—Quoc Hoang
(74) Attorney, Agent, or Firm—George O. Saile; Stephen B. Ackerman

(57) ABSTRACT

A split-gate flash memory cell having a spacer-like floating gate is disclosed as well as a method of forming the same. This is accomplished by defining a floating area opening in a structure layer over a substrate, and forming polysilicon spacers along the vertical walls of the opening. Then an intergate oxide is formed over the spacer-like floating gates followed by the forming of individual control gates. Thus, a flash memory is formed having two independent cells with their own spacer floating gates and control gates sharing one source with the capability of being shrunk in size much more readily than conventionally possible.

6 Claims, 5 Drawing Sheets

SPACER LIKE FLOATING GATE FORMATION

BACKGROUND OF THE INVENTION (1) Field of the Invention

The present invention relates to semiconductor memory devices and more particularly to a method of forming a split-gate flash memory cell having a spacer like floating gate.

(2) Description of the Related Art

With the ever increasing demand for miniaturization of semiconductor devices, it is becoming more and more necessary to scale down every possible component of the devices. A split-gate flash memory, by its very nature of being split up where the floating gate somewhat overlaps the control gate, is larger in size than a stacked-gate cell. However, as it is explained more in detail below, the split-gate has operational advantages over the stacked cell. Hence, it is desirable to keep the split-gate characteristics while shrinking the size of its components, such as the floating gate and the control gate. It is disclosed later in the embodiments of the present invention a method of fitting the floating gate as a spacer underlying the control gate so as to affect more shrinkage in size than possible through conventional means.

Over the years, numerous improvements in the performance as well as in the size of memory devices have been made by varying the simple, basic one-transistor memory cell, which contains one transistor and one capacitor. The variations consist of different methods of forming capacitors, with single, double or triple layers of polysilicon, and different materials for the word and bit lines. In general, memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell.

Most conventional flash-EEPROM cells use a double-polysilicon (poly) structure of which the well known split-gate cell is shown in FIG. 1a. Here, two MOS transistors share a source (25). Each transistor is formed on a semiconductor substrate (10) having a first doped region (20), a second doped region (25), a channel region (23), a gate oxide (30), a floating gate (40), intergate dielectric layer (50) and control gate (60). Substrate (10) and channel region (23) have a first conductivity type, and the first (20) and second (25) doped regions have a second conductivity type that is opposite the first conductivity type.

As seen in FIG. 1a, the first doped region, (20), lies within the substrate. The second doped region, (25), also lies within substrate (10) and is spaced apart form the first doped region (20). Channel region (23) lies within substrate (10) and between first (20) and second (25) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween, which in turn is formed over polyoxide cap (45).

Prior art contains many different ways of forming split-gate type transistor devices. Fukase in U.S. Pat. No. 5,989,960 shows such a device and the making of the same where the transistor has a substrate, and a floating gate electrode is located on the substrate. A control gate electrode is provided having thick and thin film sections over the floating electrode. As source region and a drain region are formed separately in the substrate. The thin film section is formed partially over the drain region and impurity is passed into the substrate through the thin film section to form the drain region.

A different split-gate flash memory cell is disclosed by Yang in U.S. Pat. No. 6,093,945 where an outwardly-diverging control gate is stacked on but separated form a pair of opposing floating gates via an inter-poly dielectric layer. The split-gate flash memory is formed by (a) forming a first dielectric layer having a trench region on a substrate; (b) forming a tunnel oxide layer in the trench region; (c) forming a first polysilicon layer covering the first dielectric layer and the tunnel oxide layer; (d) applying an an isotropic etching technique on the first polysilicon layer to form a pair of opposing polysilicon sidewall spacers on the sidewalls which will eventually become floating gates; (e) depositing an inter-poly dielectric layer on the polysilicon sidewall spacers and the tunnel oxide layer; (f) filling the channel area between the pair of polysilicon sidewall spacers with a second polysilicon layer; (g) planarizing the second polysilicon layer so that relative to the first dielectric layer to form a control gate; (h) removing the first dielectric layer, capping the control gate and the floating gate with a final oxide layer, and forming source and drain regions in the substrate using ion implantation. The split-gate flash memory eliminates the over-erase problem experienced with the self-aligned ETOX flash memory cells, while allowing its cell dimension to maintain at least the same using the conventional photolithography technique.

Ahn of U.S. Pat. No. 5,612,237 discloses still another method of making a flash memory cell in accordance with the following process steps: forming a oxide film on a portion of the silicon substrate by means of the LOCOS process using the patterned nitride film as an oxidation preventing layer; dry-etching a portion of the oxide film using the patterned nitride film as the etching mask; forming a tunnel oxide film, forming floating gates of a symmetric structure at the etched face: removing the patterned nitride film; forming source and drain regions by means of the self-aligned ion implantation method using the residual oxide film remaining below the patterned nitride film and the floating gates; removing the residual oxide film; forming a select channel region at this portion by means of the ion implantation process for controlling a threshold voltage; and then forming an interpoly oxide film and a control gate by means of the common processes.

A method of forming a dynamic random access memory (DRAM) cell is shown in U.S. Pat. No. 6,054,345 by Alsmeier, et al. Here, the cell includes a substrate, a transfer gate overlying the substrate, a storage device coupled to the transfer gate, a deep depleted region formed in the substrate under the storage means, and a bit line for initially receiving the charge and the substrate receiving the charge via the transfer gate. A process for making the same device includes depositing a first gate oxide over a substrate having a trench and depositing a nitride over the first gate oxide, forming openings in the nitride down to the gate oxide, and depositing polysilicon over the nitride and etching first spacers in the polysilicon along the sidewalls of the openings in the nitride. A second polysilicon material is deposited over the first spacers and substrate and second spacers are formed in the second polysilicon material. A contact window is opened between first and second ones of the first spacers and a highly doped polysilicon is deposited in the contact window. A contact is formed over the highly doped polysilicon.

Forming of very small structural widths using spacers is further described by Kerber in U.S. Pat. No. 6,027,972, according to which: a first layer deposited over an edge of a structure is anisotropically etched back; spacer at the edge of the structure which remains after the first layer and the structure are removed, after further deposition and etching steps, finally defines the position and width of the resulting microstructure.

While prior art offers different approaches for forming different split-gate flash memory cells, the present invention discloses, later in the embodiments of the present invention, still a different method of forming spacer-like floating gates which have their own control gates, unlike U.S. Pat. Nos. 6,093,945 and 5,612,237 cited above, and which are storage gates, unlike U.S. Pat. No. 5,989,960, and are for an EEPROM, unlike in U.S. Pat. No. 6,054,345, which are for a DRAM, and keep these spacer-like structures rather than removing them as in U.S. Pat. No. 6,027,972. The spacer process of the instant invention is also different from that of U.S. Pat. No. 6,051,470, because the spacer gate of the latter is not a floating gate. Also, the instant spacer floating gates are not cylindrical as that of U.S. Pat. No. 6,103,575.

SUMMARY OF THE INVENTION

It is therefore an object of this invention to provide a method of forming a split-gate flash memory cell with spacer-like floating gates.

It is another object of this invention to provide a method of forming split-gate flash memory by using a spacer technology.

It is still another object of the present invention to provide a method of shrinking the size of a split-gate flash memory cell through the use of a spacer technology.

It is yet another object of the present invention to provide a split-gate flash memory with two independent cells having spacer-like floating gates and control gates which provide tunneling and which share the same source.

These objects are accomplished by providing a substrate; forming a structure layer over said substrate; defining a floating area in said structure layer; forming an opening for said floating area in said structure layer; forming a tunnel oxide at the bottom of said opening; forming a floating material over said substrate, including said opening; forming floating spacers along the vertical sides of said opening; removing said structure layer; performing a source implant; forming an oxide layer over said floating spacers; forming a controlling material over said oxide layer; and etching said controlling material and said oxide layer to complete the forming of said split-gate of this invention having a spacer-like floating gate.

These objects are further accomplished by providing a substrate having active and field areas defined; a source and drain regions in said active area; floating spacers formed over and separated from said source region with a tunnel oxide; an intergate oxide layer formed over said floating spacers; and controlling layers formed over said intergate oxide layer sharing the same said source region.

DESCRIPTION OF THE PREFERRED EMBODIMENTS

Figure 1:
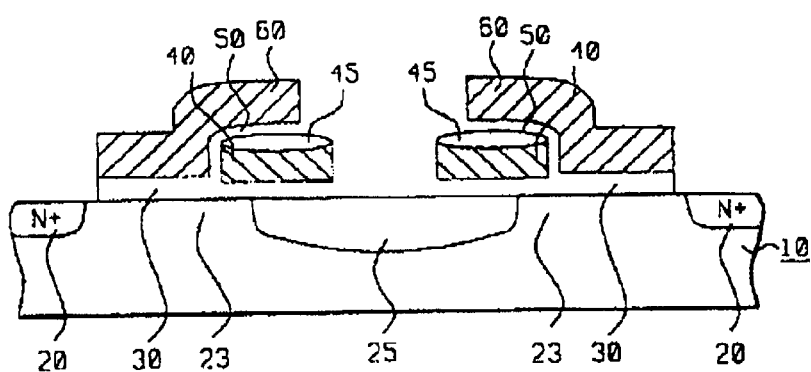
FIG. 1 shows a cross-sectional view of a split-gate type memory cell of prior art.

Referring now to the drawings, specifically to FIGS. 2a–2k, there is shown a method of forming a split-gate flash memory cell having spacer-like floating gates. This is accomplished by defining a floating area opening in a structure layer over a substrate, and forming polysilicon spacers along the vertical walls of the opening. Then an intergate oxide is formed over the spacer-like floating gates followed by the forming of individual control gates. Thus, a flash memory is formed having two independent cells with their own spacer floating gates and control gates sharing one source with the capability of being shrunk in size much more readily than conventionally possible.

Figure 2A:
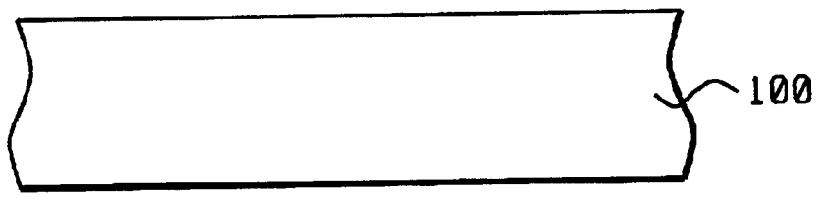
FIG. 2a is a cross-sectional view of a semiconductor substrate of this invention.
Figure 2B:
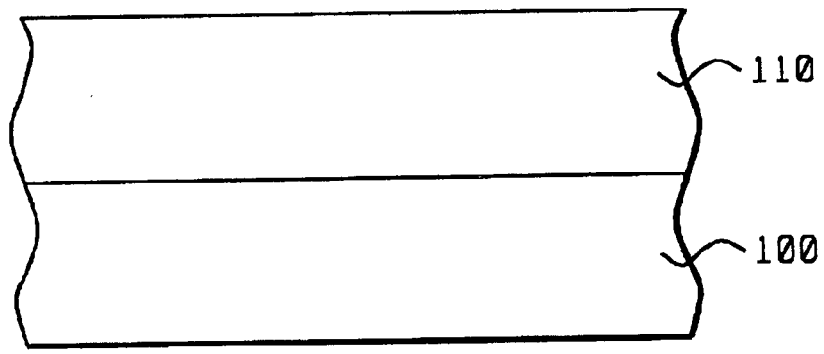
FIG. 2b is a cross-sectional view of a semiconductor substrate showing the forming of a structural layer over the substrate of FIG. 2a, according to the present invention.

In FIG. 2a, substrate (100), preferably silicon, is provided with field regions, and active device regions (neither shown) already formed using the well known methods including the LOCOS (local oxidation of silicon) method or the STI (shallow trench isolation) method. A structure layer, namely dielectric layer (110), is next formed over the substrate as shown in FIG. 2b, for the following steps of structuring floating gates within. Forming dielectric layers are known in the art. Blanket dielectric layers may be formed from materials including but not limited to silicon oxide materials, silicon nitride materials, and silicon oxynitrides materials formed within integrated circuits through methods including but not limited do chemical vapor deposition (CVD), plasma enhanced CVD (PECVD), or, physical vapor deposition (PVD) sputtering methods. For the preferred embodiment of the present invention, layer (110) is preferably formed of a dielectric material chosen from the group of dielectric materials consisting of silicon oxide dielectric materials, silicon nitride, and silicon oxynitride.

Figure 2C:
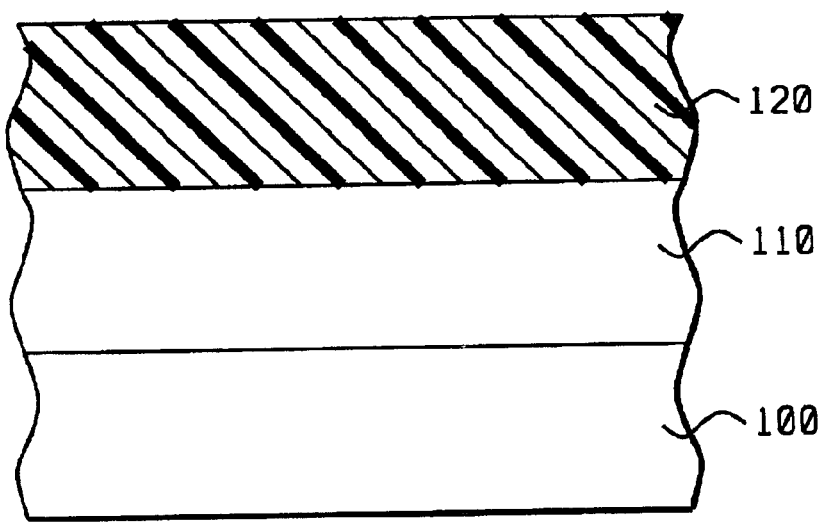
FIG. 2c is a cross-sectional view of a semiconductor substrate showing the forming of a photoresist layer over the structural layer of FIG. 2b, according to the present invention.
Figure 2D:
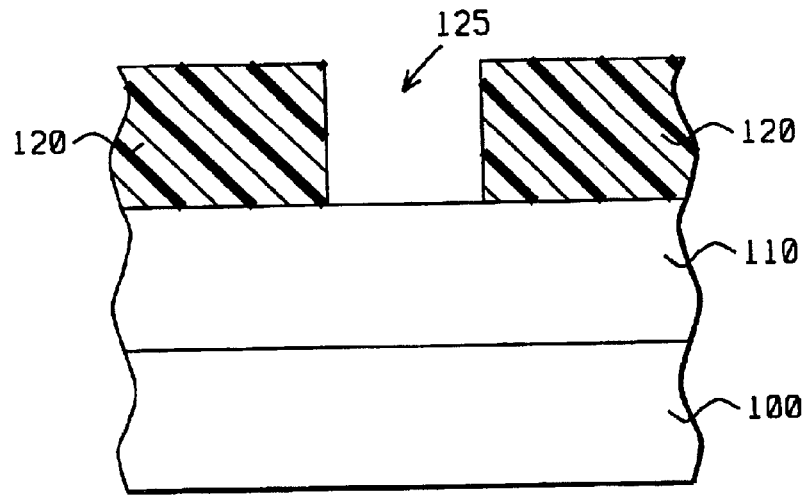
FIG. 2d is a cross-sectional view of a semiconductor substrate showing the floating area patterning of the photoresist layer of FIG. 2c, according to the present invention.
Figure 2E:
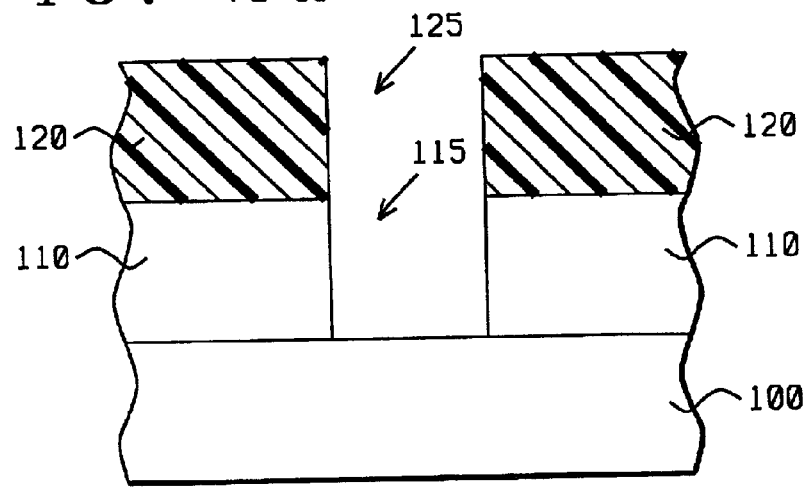
FIG. 2e is a cross-sectional view of a semiconductor substrate showing the transferal of the floating area opening in the photoresist of FIG. 2d into the structural layer of the same, according to the present invention.
Figure 2F:
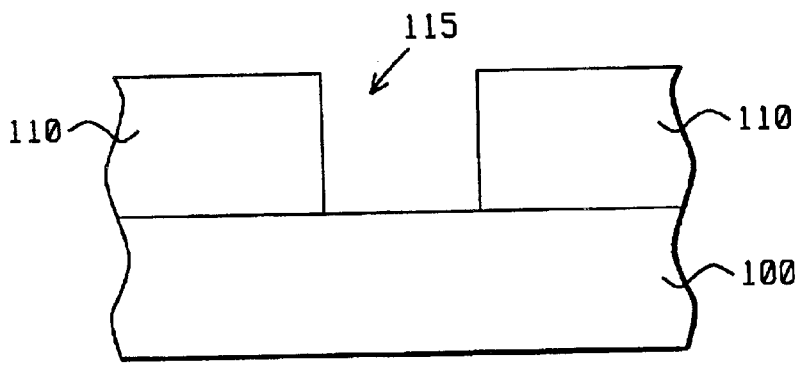
FIG. 2f is a cross-sectional view of a semiconductor substrate showing the removal of the photomask of FIG. 2e, according to the present invention.
Figure 2G:
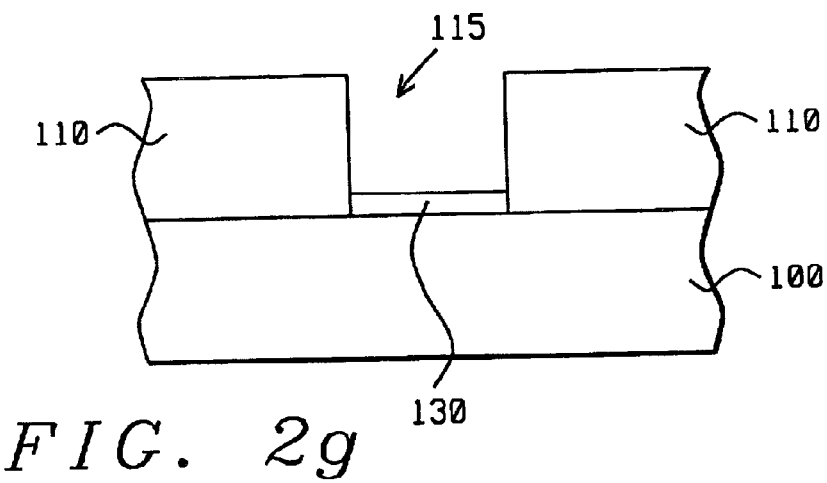
FIG. 2g is a cross-sectional view of a semiconductor substrate showing the forming of tunnel oxide at the bottom of the opening of FIG. 2h, according to the present invention.

An area for the floating gates to be formed is delineated in the structural layer by first forming photoresist layer (120) on the substrate as shown in FIG. 2c, and then patterning it with opening (125) as shown in FIG. 2d. The opening for the floating area is formed by etching the structural layer, thus transferring opening (125) in the photomask into layer (110) to form opening (115) as shown in FIG. 2e. Then the photomask is removed using oxygen plasma ashing, for example, as shown in FIG. 2f.

Figure 2H:
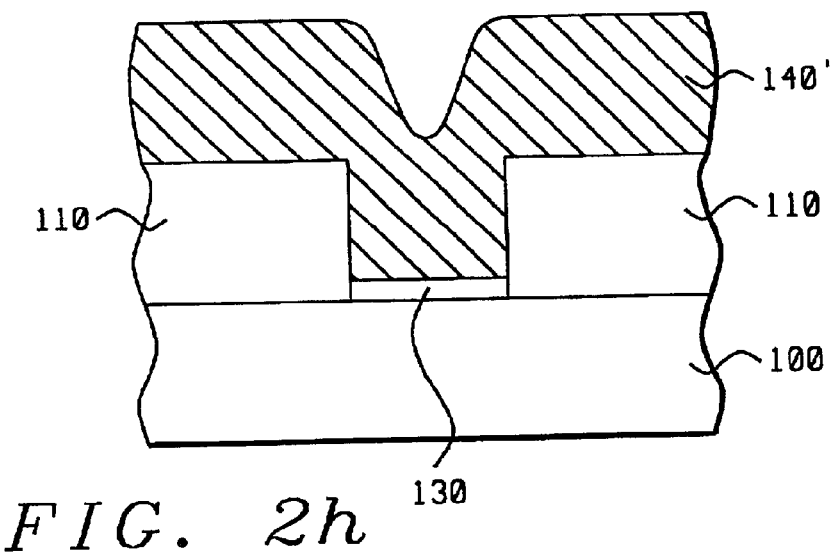
FIG. 2h is a cross-sectional view of a semiconductor substrate showing the forming of floating material over the substrate, including the opening of FIG. 2g, according to the present invention.

Tunnel oxide (130) is next grown at the bottom of opening (115) by thermal growth. This is followed, by depositing floating material (140') over the substrate, including into opening (145), as shown in FIG. 2h. It is preferred that the floating material to form floating gates is polysilicon. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source.

Figure 2I:
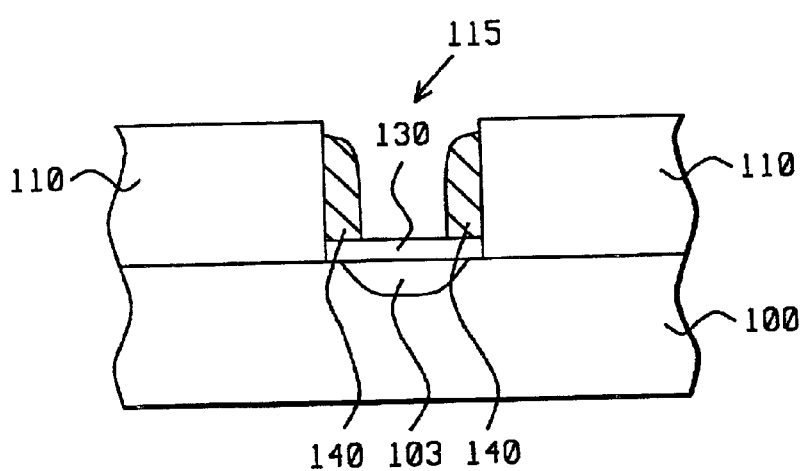
FIG. 2i is a cross-sectional view of a semiconductor substrate showing the forming of the spacer-like floating gates of the present invention.

As a main feature and key aspect the present invention, spacer technology is next used to form spacer-like floating gates along the vertical walls of opening (115), as shown in FIG. 2i. That is, floating material (140'), namely polysilicon, is etched back anisotropically to form spacers (140). It will be noted that spacers (140) can be shaped into any desired height and width by controlling the etching parameters, and hence to any desired shrink factor. Preferably, the height and width of spacer-like floating gates (140) are between about 50 to 10000 Å, and 50 to 10000 Å, respectively.

Having formed the spacer-like floating gates of the present invention, the structure, or structural layer (110) is no longer needed, and hence, is removed by etching. Subsequently, a source line photolithography is performed, as practiced in the art, and hence not shown. Then, a source implant is performed to form source (103) shown in FIG. 2i.

Figure 2J:
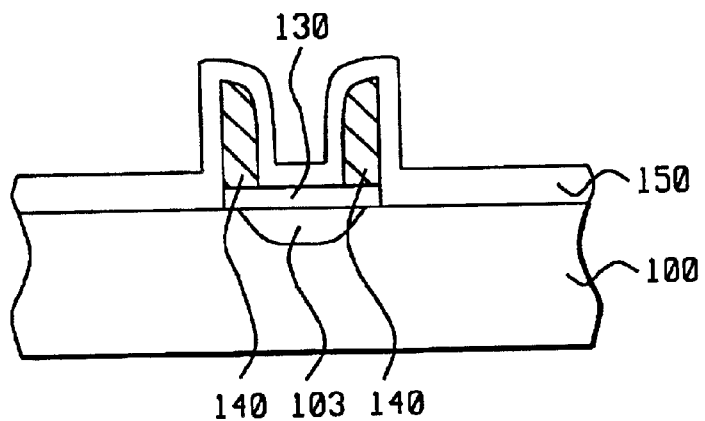
FIG. 2j is a cross-sectional view of a semiconductor substrate showing the forming of an inter-gate oxide layer over the spacer floating gates of FIG. 2i, according to the present invention.

An oxide layer, to serve as inter-gate oxide layer (150), is next formed over the substrate, including over spacers (140), as shown in FIG. 2j. The preferred method of forming the oxide layer is by thermal oxidation in a dry oxygen carried out in an oxidation furnace. Alternatively, other oxidation methods can be used, such as oxidation in a dry oxygen and anhydrous hydrogen chloride in an atmospheric or low pressure environment, or low temperature, high-pressure, and the like.

This is followed by forming a controlling material, such as second polysilicon layer (160') shown in FIG. 2j, preferably using the same LPCVD method as in forming the first polysilicon layer, with silane $SiH_4$ as a silicon source material. This polysilicon layer, preferably having a thickness between about 50 to 10000 Å, will next be formed into a control gate over the spacer-like floating gate of this invention, separated by an inter-gate oxide layer.

Figure 2K:
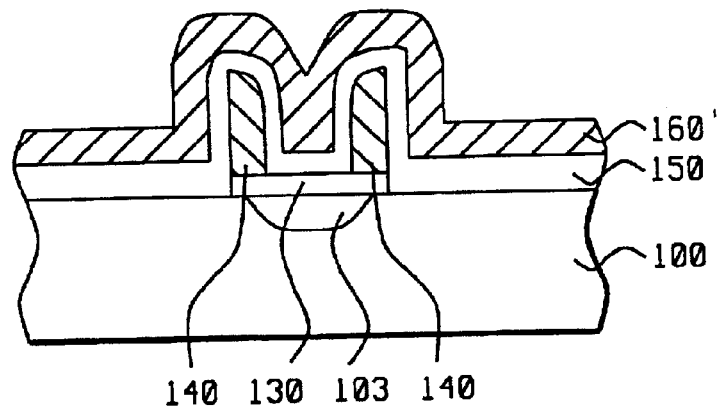
FIG. 2k is a cross-sectional view of a semiconductor substrate showing the forming control gates over the spacer-like floating gates of the present invention.
Figure 2L:
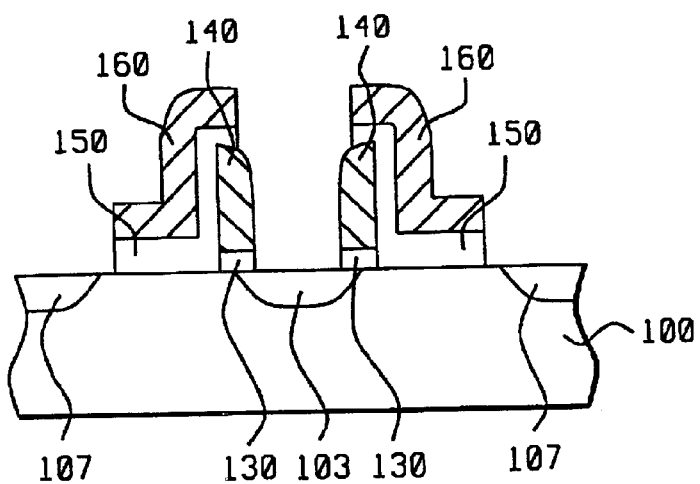
FIG. 2l shows the forming of drains through ion implanting, hence the completion of the split-gate flash memory cell of the present invention.

At the next step, a second photoresist layer (not shown) is formed over the substrate and patterned to define controlling area to form control gates over the inter-gate oxide layer. Both layers (160') and (150) are etched through the pattern in the second photomask to form control gates (160) over the spacer-like floating gates of the invention, with an intervening gate-oxide layer (150), as seen in FIG. 2k. This is followed by forming drains (107) through ion implanting, hence completing the forming of the split-gate flash memory cell of the invention.

While the invention has been particularly shown and described with reference to the preferred embodiments thereof, it will be understood by those skilled in the art that various changes in form and details may be made without departing from the spirit and scope of the invention.

What is claimed is:

1. A method of forming split-gate flash m mory cell having a spacer-like floating gate comprising the sequential steps of:

providing a substrate having a surface;

forming a single layer structure over said substrate;

defining a floating gate area in said single layer structure;

forming an opening for said floating gate area in said single layer structure;

forming a tunnel oxide layer on said surface of said substrate in said opening;

forming a floating gate material on said single layer structure, including on the vertical walls of said single layer structure in said opening, and on said tunnel oxide in said opening;

forming spacer-like floating gates along the vertical sides of said of said single layer structure in said opening, wherein said spacer-like floating gates have a height and width between about 50 to 10000 Å;

removing said single layer structure;

defining a source line area between said spacer-like floating gates;

performing a source implant between said spacer-like floating gates;

forming an oxide layer over said spacer-like floating gates, on said tunnel oxide layer and on the surface of said substrate;

forming a controlling material over said oxide layer;

etching said controlling material, said oxide layer and said tunnel oxide layer to complete the forming of said spacer-like floating gate; and performing a drain implant.

2. The method of claim 1, wherein said substrate is silicon.

3. The method of claim 1, wherein said single layer structure is an insulating layer comprising $SiO_2$, $Si_3N_4$ or oxynitride.

4. The method of claim 1, wherein said defining said floating area is accomplished by patterning said structure layer with a photoresist mask.

5. The method of claim 1, wherein said floating material has a thickness between about 50 to 10000 Å.

6. The method of claim 1, wherein said controlling material has a thickness between about 50 to 10000 Å.

* * * * *